United States Patent [19]

Kiesewetter et al.

[11] Patent Number: 5,317,223

[45] Date of Patent: *May 31, 1994

[54] METHOD AND DEVICE IN MAGNETOSTRICTIVE MOTION SYSTEMS

[75] Inventors: Lothar E. Kiesewetter, Berlin, Fed. Rep. of Germany; Fredy Olsson, Malmö, Sweden; Carl H. Tyrén, Antibes, France

[73] Assignee: Dynamotive Corporation, Newport, R.I.

[*] Notice: The portion of the term of this patent subsequent to Apr. 30, 2009 has been disclaimed.

[21] Appl. No.: 628,923

[22] Filed: Dec. 10, 1990

Related U.S. Application Data

[63] Continuation of Ser. No. 411,464, Sep. 21, 1989, abandoned.

[30] Foreign Application Priority Data

Jan. 21, 1987 [SE] Sweden ............... 8700219

[51] Int. Cl.⁵ .................. H02N 2/00; H01L 41/12
[52] U.S. Cl. ............................. 310/26; 318/118
[58] Field of Search ............ 310/15, 26; 318/118

[56] References Cited

U.S. PATENT DOCUMENTS

| | | | |
|---|---|---|---|
| 2,506,141 | 5/1950 | Drouin | 33/41.1 |
| 4,017,754 | 4/1977 | Jarrett et al. | 310/26 |
| 4,894,579 | 1/1990 | Higuchi et al. | 310/328 |
| 4,917,579 | 4/1990 | Torma | 417/322 |

FOREIGN PATENT DOCUMENTS 1933205 1/1971 Fed. Rep. of Germany .
53-27103 3/1978 Japan .
765913 11/1978 U.S.S.R. .
2174554 11/1986 United Kingdom .

OTHER PUBLICATIONS

"Jattemagnetostriktion ger Kansligare Givare" appearing in Elteknik Med Aktuell Elektronik, 1984, is translated as Giant Magnetostriction Provides More Sensitive Transducers.

*Primary Examiner*—Steven L. Stephan
*Assistant Examiner*—Judson H. Jones

[57] ABSTRACT

Method and device for making a first body (8), having a magnetostrictive properties, and a second body (6), against which said first body is in bearing contact with a certain grip between the contact surfaces, to move with respect to each other while substantially maintaining said grip. According to the invention a magnetic field is made to sequentially influence only one of adjacent partial sections of said magnetostrictive body (8), starting from the front end of the body as seen in the intended direction of movement. The magnetic field is adjusted so that the respective partial section under the influence of the magnetic field undergoes an increase in length, at the same time being subject to a contraction in the transverse direction which is big enough in order to decrease, preferably eliminate the grip between the bodies. The device includes a rod (8) of magnetostrictive material, which is clamped within a tubular body (6), one end of which being attached to a rigid supporting structure. The magnetostrictive rod (8) is connected to a bar, a link etc. having its opposite end connected to the element to be actuated by the movement of the rod in the tubular body (6).

16 Claims, 2 Drawing Sheets

METHOD AND DEVICE IN MAGNETOSTRICTIVE MOTION SYSTEMS This is a continuation of application Ser. No. 07/411,464, filed Sep. 21, 1989 now abandoned.

The present invention relates to a method of making a first body, having magnetostrictive properties, and a second body, against which said first body is in bearing contact with a certain grip between the contact surfaces, to move with respect to each other while maintaining substantially said grip, and a device for carrying out the method.

One object of the invention is to provide a method and a device of the kind mentioned above, which is adapted for use in linear motors in which high precision of the resulting movement is required, e.g. adjusting motors wherein the requirements with respect to length of stroke and power output are small, but also in such linear motors in which larger stroke and power output is required, e.g. motors used as power and motion generating units in the operation of lifting devices. A further object of the invention is to provide a method and a device of the kind mentioned initially, which in a simple manner renders possible a finely adjustable and accurate control of the intended movement.

These and other objects of the invention are obtained by means of a method and a device having the characteristics specified in the appended claims.

The invention is described below with reference to the embodiments illustrated schematically on the appended drawings.

Figure 1A:
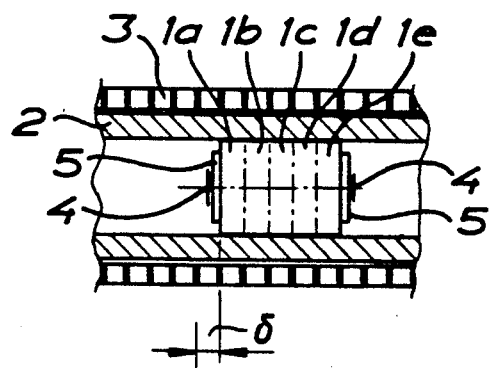
FIGS. 1A–1G illustrate very schematically and step by step the realization of the method according to the invention with reference to an embodiment including a magnetostrictive rod which by shrinking fit is disposed within a tubular body.

The present invention is based on the fact, that magnetostrictive materials change their geometrical dimensions under the influence of a magnetic field. A rod of magnetostrictive material of a certain composition will thus undergo an increase in length under the influence of a magnetic field at the same time as the transverse dimensions of the rod decrease.

The method according to the invention utilises this phenomenon, which will be explained in more detail in the following under reference to the schematic FIGS. 1A–1G.

In the embodiments illustrated in said figures, a cylindrical rod 1 of a magnetostrictive material of the kind which undergoes a simultaneous change in length and transversal contraction under the influence of a magnetic field, is by means of shrinking disposed within a cylindrical tube 2, preferably of a non-magnetic material, so that the magnetostrictive rod 1 is clamped within the tube 2 with a certain clamping grip. Along the entire length the rod 2 is surrounded by a great number of magnetic coils 3 disposed adjacent each other, each one of said coils being connectable sequentially, one after the other, to a current supplying source for generating a magnetic field. Each magnetic coil 3 is dimensioned so as to generate a magnetic field influencing only a partial section of the magnetostrictive rod 2. For facilitating the understanding, the magnetostrictive rod illustrated in FIGS. 1A–1G has been divided into five sections 1a–1e disposed adjacent each other, the dividing line between adjacent sections being marked as a dash-and-dot line. Each section 1a–1e is presupposed to correspond to the length of the rod 1 which is influenced by the magnetic field generated by one of the coils 3. Each magnetic coil 3 is designed so that the magnetic field generated when current is supplied to the coil, causes an increase in length of the section being influenced, the section simultaneously undergoing a transverse contraction of such a magnitude that the clamping grip against the tube 2 decreases considerably and preferably is eliminated. The magnetostrictive rod 1 is further prestressed in a direction opposite the direction of the change in length under the influence of the magnetic field. The object of said prestressing is to eliminate the influence i.a. of mechanical hysteresis, so that no remaining dimensional change of the magnetostrictive rod is obtained when the influence of the magnetic field ceases. The prestressing may e.g. be accomplished by means of a bolt 4 extending axially through the magnetic rod, so that said bolt when being tightened generates a compressional force in the magnetostrictive rod, the traction force of the bolt 4 being transmitted to the rod 1 via two end washers 5 positioned on opposite end surfaces of the rod 1.

FIG. 1A illustrates the device in rest position. No one of the magnetic coils 3 is supplied with current, and the magnetostrictive rod 1 is thus firmly clamped within the surrounding tube 2 with a certain clamping grip. The initial clamping grip, i.e. the clamping grip at unloaded condition, is chosen to have a predetermined value which then may be subject to variations depending of the load upon the device.

Figure 1B:
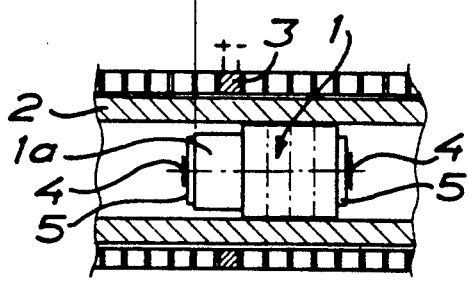
Figure 1C:
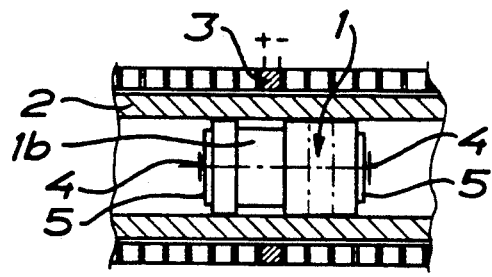
Figure 1D:
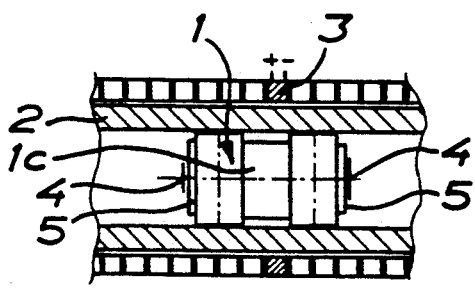
Figure 1E:
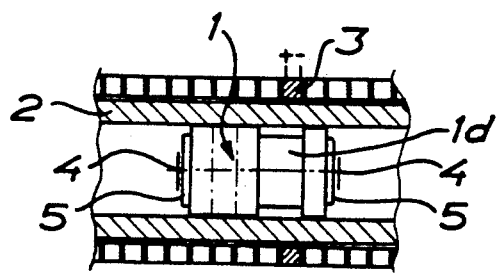
Figure 1F:
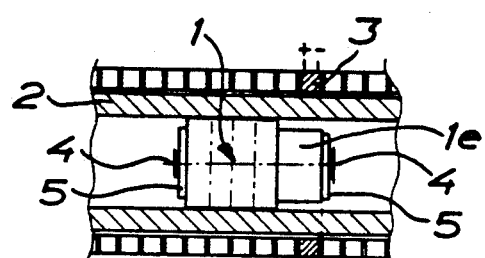
Figure 1G:
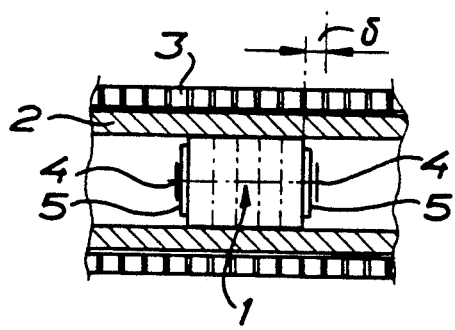

FIG. 1B illustrates the condition resulting from a supply of current to the magnetic coil 3 situated just opposite, i.e. in the same transversal plane as the first section 1a of the magnetostrictive rod 1 as seen in the intended direction of movement. The section 1a is thereby subjected to an increase in length, illustrated in the figure in greatly enlarged scale, the section simultaneously undergoing a contraction in the transverse direction, so that the clamping grip of the section against the inside of tube 2 is eliminated, as illustrated in the figure in greatly enlarged scale. If the supply of current to the coil is interrupted, section 1a will revert to initial dimensions, and if no current is supplied to the magnetic coil situated just opposite the adjacent section 1b, section 1a will revert to initial conditions as well with respect to dimensions as with respect to position, i.e. the position illustrated in FIG. 1A.

If the magnetic coil 3 situated just opposite the next adjacent section 1b is supplied with current simultaneously with or in connection with the interruption of current supply to the magnetic coil situated just opposite section 1a, section 1b increases in length and is simultaneously subjected to transverse contraction resulting in that the interface between the sections 1a and 1b, represented in the figures by a dash-and-dot line, is moved in the forward direction in the intended direction of movement. Section 1a returns to initial dimensions in the longitudinal and transverse directions, but remains in the forwardly advanced position, resulting in the position illustrated in FIG. 1C.

The method steps described above are then repeated sequentially, one after the other, for each one of the sections 1a-1e as illustrated in FIGS. 1A-1G. When the position illustrated in FIG. 1G has been attained, the magnetostrictive rod 1 thus has moved a distance δ1 in the intended direction of movement.

The method is then repeated, starting with section 1a.

Since each one of the sections 1a-1e in fact only represent a small fraction of the total length of the magnetostrictive rod 1, it should be obvious that the clamping grip of the magnetostrictive rod 1 against the inside of tube 2 remains substantially unchanged during the displacement.

By controlling the supply of current to the magnetic coils 3 so that the method steps described above are repeated sequentially, one after the other, the magnetostrictive rod 1 may be made to move over the desired distance within the tube 2. If the magnitude of the respective magnetic field is adjusted so that the respective section 1a-1e which is influenced, is caused to lose its clamping grip against the inside of tube 2, the movement of the magnetostrictive rod 1 takes place without sliding friction. If tube 2 is supported by a rigid supporting construction and the magnetostrictive rod 1 by means of a bar is connected to a working tool, the magnetostrictive rod 1 can be made to exert a power actuation on the working tool in the intended direction of movement. The magnitude of this actuating force depends i.a. of the clamping grip between the tube 2 and the magnestrictive rod 1.

The movement of the magnetostrictive rod may be controlled in a very simple manner by controlling the supply of current to the coils 3.

In the embodiment illustrated in the figures, the magnetostrictive rod 1 is clamped within the tube 2 by means of shrinking. The method according to the invention may, however, be applied in a corresponding way as described above also to an embodiment, in which the magnetostrictive rod consists of a hollow body which is shrinked upon a rod extending through the hollow body and preferably consisting of non-magnetic material.

Figure 2:
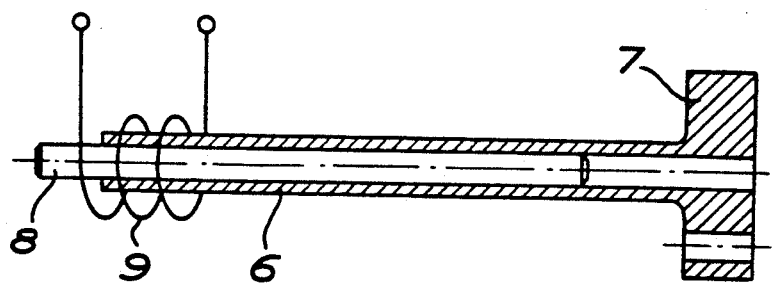
FIG. 2 is a longitudinal section through a schematically illustrated translation motor for carrying out the method according to the invention.
Figure 3:
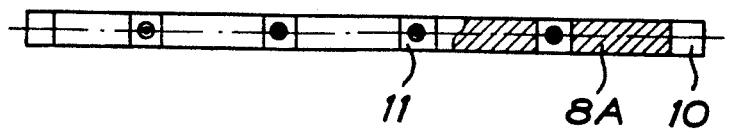
FIG. 3 illustrates schematically the magnetostrictive rod included into the translation motor of FIG. 2 and the preloading of said rod.

FIGS. 2 and 3 illustrate a translation motor in which the method according to the invention is applied.

As appears in FIG. 2 the motor includes a tubular portion 6, one end of which being provided with a flange 7 for attaching the tubular portion 6 to a rigid support. In the bore of the tubular portion 6, a magnetostrictive rod 8 is clamped by tight fit, the magnetostrictive rod protruding outside the end of the tubular portion 6 and is connected to the tool or other means to be actuated when the rod 8 is being displaced.

In order to accomplish the movement of rod 8, use is made of a magnetic coil 9 surrounding the tubular portion 6 and being connectable to a source of electric current. When current is supplied to the coil a magnetic field is generated and the part of the rod 8 which is influenced by the magnetic field will be subject to elongation and at the same time contraction in the radial direction. It is of course possible to displace the coil 9 along the tube 6 and thus accomplish a wormlike movement of displacement of rod 8. In practice, however, it is more convenient to have a number of magnetic coils positioned along the tube, and to supply the magnetic coils sequentially, one after the other, with current in order to accomplish the displacement of the rod 8 within the tube 6 in the manner described previously.

In the embodiment illustrated in FIG. 3 the magnetostrictive rod 8 is divided into a plurality of sections 8a, which are interconnected by means of a prestressing wire 10 via attachment pieces 11 disposed between adjacent sections 8a. This results in that each one of the sections 8a as well as rod 8 is subject to the desired prestressing in the axial direction of rod 8 and over the entire length thereof. As mentioned previously the prestressing is needed in order to accomplish that the rod, after having been influenced by the magnetic fields, shall return to its initial dimensions. The prestressing may, however, be accomplished in many different ways, and FIG. 3 only illustrates one example of such prestressing.

As appears from the foregoing it is an important feature according to the invention that the rod 1, 8 consists of a magnetostrictive material. Preferably the rod 1, 8 is made of so called giant magnetostrictive material, e.g. an alloy between rare earth metals such as samarium (Sm), terbium (Tb), dysprosium (Dy), holmium (Ho), erbium (Er), tulium (Tm) and magnetic transition metals such as iron (Fe), cobalt (Co) and nickel (Ni). This group of alloys presents the largest magnetostriction known so far, e.g. possessing the property to undergo a change in dimension under the influence of a magnetic field, said change in dimension being proportional to the intensity of the magnetic field. It has been found that the magnitude of the magnetostriction in these materials is of a quite different range than is the case in ordinary magnetostrictive materials, e.g. iron-nickel. As an example it may hast be mentioned that for a certain magnetic field iron-nickel undergoes a change in length of 20-30 $\mu$m/m, whereas an alloy of e.g. terbium-dysprosiumiron undergoes a change in length of 2400 $\mu$m/m. The change in length to which said giant magnetostrictive materials are subject under the influence of the magnetic field may be positive or negative, e.g. may for certain of said compositions result in an increase in length and for other of said compositions result in a decrease in length. In the present invention, however, it is preferred to use giant magnetostrictive materials of the kind being subject to an increase in length under the influence of a magnetic field. Within the group of giant magnetostrictive materials the magnitude of the magnetostriction under the influence of a certain magnetic field varies, and it is of course preferred in the embodiments according to the present invention to use giant magnetostrictive materials having the largest magnetostrictive properties.

As mentioned previously it is necessary in order to obtain a satisfactory result that the magnetostrictive element used for generating the movement is prestressed in a direction opposite the direction of movement. The prestressing thus neutralizes mechanical hysteresis in the magnetostrictive material. In accordance with an alternative to the embodiment described with reference to FIG. 3 for providing said prestressing, the rod may consist of plates or sheets of magnetostrictive material extending in the longitudinal direction of the rod, said plates or sheets being glued together via intermediate layers of fibrous material. During the manufacture of said laminated rods, the plates or sheets of magnetostrictive material are preloaded in the axial direction and are connected in prestressed condition to the intermediate fibrous layers by means of gluing. As an alternative it is possible instead to impose a traction force on the fibres before and during the gluing operation. The preloading is then released when the glue has become hard, i.e. has cured. In such a rod each section of the laminated rod is prestressed as intended. An additional advantage with laminated rods is that the lamination results in a reduction of eddy current losses.

The invention is not limited to the embodiments described with reference to the figures, but may be subject to variations within the scope of the appended claims. The magnetostrictive body may thus be clamped between two plane-parallel plates, and by using the magnetic field in the principle way described previously, the magnetostrictive body may be caused to move between the plates in the planes thereof, the clamping grip with respect to the plates being kept substantially unchanged. Possibly the grip between the magnetostrictive body and the plate may be obtained solely through the dead weight of the body. In the latter case the body is only resting upon and supported by a plane plate and does not need to be clamped between to plane-parallel plates.

We claim:

1. Method of making a first body (1, 8) having magnetostrictive properties and a second body (2, 6), against which said first body is in bearing contact with a certain grip between the contact surfaces, to move with respect to each other while substantially maintaining said grip, characterized in that a magnetic field is made to influence sequentially only one of adjacent partial sections (1a-1e) of said first body (1, 8), starting with the front end of the body as seen in the intended direction of movement, said magnetic field being adjusted so that under the influence of the magnetic field the respective partial section undergoes an increase in length and simultaneously a contraction in the transverse direction, the magnitude of which being great enough in order to decrease, preferably eliminate the grip between said bodies.

2. Method as claimed in claim 1, characterized in that said first body (1, 8) is shaped as a rod and said secondary body as a hollow body (2, 6), said rod being clamped within the hollow body between the walls thereof with a predetermined clamping grip in the transverse direction of the rod.

3. Method as claimed in claim 1, characterized in that said first body (1, 8) is shaped as a hollow body and said secondary body (2, 6) as a rod, said hollow body encircling the rod and being clamped against the rod in the transverse direction thereof and with a predetermined clamping grip.

4. Method as claimed in claim 1, characterized in that said first body (1, 8) of a material having magnetostrictive properties is mechanically pre-stressed, said pre-stressing being directed opposite the increase in length caused by the magnetic field.

5. Device for carrying out the method according to claim 1, characterized by a first body (1, 8) of a material having magnetostrictive properties, and a second body (2, 6), preferably from non-magnetic material, said both bodies being arranged in bearing contact with each other with a certain grip between the contact surfaces, means (3, 9) for generating a magnetic field and for causing the magnetic field to sequentially influence only one partial section of said first body (1, 8), starting from the front end of the body as seen in the intended direction of movement, and for adjusting the magnetic field so that the respective partial section under the influence of the magnetic field undergoes an increase in length and simultaneously a contraction in the transverse direction of a magnitude sufficient in order to decrease, preferably eliminate the grip between said bodies.

6. Device as claimed in claim 5, characterized in that said means for generating a magnetic field includes a number of magnet coils (3, 9) disposed adjacent each other, said magnet coils surrounding said first and said second bodies which are arranged in contact with each other, each magnet coil (3, 9) being separately connectable to an electric source of current.

7. Device as claimed in claim 5, characterized in that said first body (1, 8) consists of a rod of magnetostrictive material, which is clamped within a tubular body (2, 6) with a certain clamping grip between the rod the inside of the tube walls.

8. Device as claimed in claim 7, characterized in that said tubular body (6) is attached to a rigid supporting structure, said magnetostrictive rod which is clamped within the tubular body being connected to a rod, a link etc., the opposite end of which being connected with the element to be actuated when the rod is made to move within the tubular body.

9. Device as claimed in claim 5, characterized in that said first body (1, 8) consists of a hollow body and said second body (2, 6) of a rod, said hollow body of magnetostrictive material surrounding said rod and being clamped against the latter with a certain clamping grip between the contact surfaces between the hollow body and the rod.

10. Device as claimed in claim 5, characterized in that said first body (1, 8) having magnetostrictive properties includes at least one plane surface by means of which the body is in bearing contact against a supporting surface and is pressed against the supporting surface so that a certain grip is obtained between the contact surfaces.

11. Device as claimed in claim 10, characterized in that said first body (1, 8) includes two plane parallel surfaces and is clamped between two plane parallel plates so that a certain grip is obtained between the contact surfaces.

12. Device as claimed in claim 1, characterized in that said first body (1, 8) having magnetostrictive properties is pre-stressed with a compressive stress acting in a direction opposite the direction of the increase in length to which the body is subject under the influence of said magnetic field.

13. Device as claimed in claim 1, characterized in that said first body (1, 8) includes a plurality of partial sections (8a) and partial pieces (11) disposed on opposite sides of each partial section, a pre-stressing bar (10), e.g. a pre-stressing wire, extending axially through all partial pieces (11) and partial sections (8a) and being attached in pre-stressed condition to each one of said partial pieces (11).

14. Device as claimed in claim 1, characterized in that said first body (1, 8) includes a number of sheets of magnetostrictive material extending in the longitudinal direction of the body, said sheets being attached to each other by means of gluing via intermediate fibre layers under simultaneous pre-stressing by compressing the sheets in the longitudinal direction thereof.

15. Device as claimed in claim 1, characterized in that said first body (1, 8) includes a number of sheets of magnetostrictive material extending in the longitudinal direction of the body, said sheets being laminated and glued together with intermediate fibre layers, said fibres being subject to a tractional force before and during the gluing operation.

16. Device as claimed in claim 1, characterized in that said first body (1, 8) having magnetostrictive properties completely or partially is made of a giant magnetostrictive material, i.e. of an alloy between rare earth metals, such as samarium (Sm), terbium (Tb), dysprosium (Dy), holmium (Ho), erbium (Er), tulium (Tm) and magnetic transition metals such as iron (Fe), cobalt (Co) and nickel (Ni).

* * * * *